United States Patent
Ojima et al.

(10) Patent No.: US 12,376,497 B2
(45) Date of Patent: Jul. 29, 2025

(54) PIEZOELECTRIC VIBRATOR AND MANUFACTURING METHOD THEREFOR

(71) Applicant: Murata Manufacturing Co., Ltd., Nagaokakyo (JP)

(72) Inventors: Shigeo Ojima, Nagaokakyo (JP); Masaki Ushiro, Nagaokakayo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 835 days.

(21) Appl. No.: 17/651,483

(22) Filed: Feb. 17, 2022

(65) Prior Publication Data

US 2022/0199892 A1  Jun. 23, 2022

Related U.S. Application Data

(63) Continuation of application No. PCT/JP2020/019308, filed on May 14, 2020.

(30) Foreign Application Priority Data

Sep. 26, 2019 (JP) .................... 2019-175977

(51) Int. Cl.
| | | |
|---|---|---|
| H01L 41/047 | (2006.01) | |
| H03H 3/02 | (2006.01) | |
| H03H 9/19 | (2006.01) | |
| H10N 30/87 | (2023.01) | |

(52) U.S. Cl.
CPC ........... *H10N 30/875* (2023.02); *H03H 3/02* (2013.01); *H03H 9/19* (2013.01)

(58) Field of Classification Search
CPC ......... H10N 30/875; H10N 30/87; H03H 9/19
See application file for complete search history.

(56) References Cited

U.S. PATENT DOCUMENTS

| | | | | |
|---|---|---|---|---|
| 2007/0216735 | A1* | 9/2007 | Kobayashi | B41J 2/14233 347/68 |
| 2010/0026141 | A1* | 2/2010 | Osawa | G10K 11/004 310/335 |
| 2010/0244630 | A1* | 9/2010 | Wada | H03H 9/19 29/25.35 |
| 2014/0028155 | A1* | 1/2014 | Oishibashi | H01L 24/94 310/365 |

(Continued)

FOREIGN PATENT DOCUMENTS

| | | |
|---|---|---|
| JP | S57107624 A | 7/1982 |
| JP | H07-308317 A | 11/1995 |

(Continued)

OTHER PUBLICATIONS

International Search Report issued for PCT/JP2020/019308, date of mailing Jul. 21, 2020.

*Primary Examiner* — Bryan P Gordon
(74) *Attorney, Agent, or Firm* — ArentFox Schiff LLP

(57) ABSTRACT

A piezoelectric vibrator having a piezoelectric vibration element that includes a piezoelectric piece and a pair of electrodes that face each other with the piezoelectric piece interposed therebetween; a holder that accommodates the piezoelectric vibration element; a resin layer covering at least one electrode of the pair of electrodes; and a water-repellent layer, which has a lower moisture permeability than the resin layer, between the electrode and the resin layer.

12 Claims, 11 Drawing Sheets

(56) References Cited

U.S. PATENT DOCUMENTS

2016/0172110 A1* 6/2016 Otani .................. H10N 30/063
361/301.4

FOREIGN PATENT DOCUMENTS

| JP | 2003198312 A | 7/2003 |
| JP | 2006217253 A | 8/2006 |
| JP | 2010232806 A | 10/2010 |

* cited by examiner

PIEZOELECTRIC VIBRATOR AND MANUFACTURING METHOD THEREFOR

CROSS REFERENCE TO RELATED APPLICATIONS

The present application is a continuation of International application No. PCT/JP2020/019308, filed May 14, 2020, which claims priority to Japanese Patent Application No. 2019-175977, filed Sep. 26, 2019, the entire contents of each of which are incorporated herein by reference.

FIELD OF THE INVENTION

The present invention relates to a piezoelectric vibrator and a manufacturing method therefor.

BACKGROUND OF THE INVENTION

Piezoelectric vibrators are used as timing devices, sensors, oscillators, and so on in various electronic appliances such as mobile communication terminals, communication base stations, home appliances, and so forth. For example, a piezoelectric vibrator consists of a piezoelectric vibration element, which includes a mechanical vibration part that converts electrical vibrations into mechanical vibrations using the piezoelectric effect, a holder that accommodates the piezoelectric vibration element, and an electrically conductive holding member that electrically connects the piezoelectric vibration element and the holder to each other. The electrically conductive holding member is composed of, for example, a cured electrically conductive adhesive having silicone resin as a main component.

Patent Document 1 discloses a method of suppressing frequency fluctuations in piezoelectric vibrators by preventing a siloxane component evaporated from a silicone-based adhesive from depositing over the entire surface of an excitation electrode by forming a monomolecular film on the excitation electrode by allowing silicone molecules to chemically adsorb over the entire surface of the excitation electrode, which is formed by depositing gold on a surface layer of a piezoelectric substrate using chromium as a base film.

Patent Document 1: Japanese Unexamined Patent Application Publication No. 2006-217253

SUMMARY OF THE INVENTION

However, with the method described in Patent Document 1, frequency fluctuations sometimes occurred as a result of the chromium of the base film diffusing during the process of manufacturing the piezoelectric vibrator and rising up from grain boundaries between gold grains and the chromium exposed from the monomolecular film becoming oxidized or hydroxylated.

The present invention was made in light of the above-described circumstances and it is an object of the present invention to provide a piezoelectric vibrator having improved frequency stability and a manufacturing method therefor.

A piezoelectric vibrator according to an aspect of the present invention includes: a piezoelectric vibration element that includes a piezoelectric piece and a pair of electrodes that face each other with the piezoelectric piece interposed therebetween; a holder that accommodates the piezoelectric vibration element; a resin layer covering at least one electrode of the pair of electrodes; and a water-repellent layer, which has a lower moisture permeability than the resin layer, between the electrode and the resin layer.

A piezoelectric vibrator manufacturing method according to another aspect of the present invention includes: preparing a piezoelectric piece; providing a pair of electrodes that face each other with the piezoelectric piece interposed therebetween to form a piezoelectric vibration element; mounting the piezoelectric vibration element on a base member using an electrically conductive holding member; adjusting a frequency of the piezoelectric vibration element by removing part of a first electrode of the pair of electrodes that is on a side of the piezoelectric vibration element opposite to a side facing the base member; annealing the pair of electrodes so as to cause part of the electrically conductive holding member to disperse and deposit on surfaces of the pair of electrodes to form a water-repellant layer; and bonding a cover member to the base member using a bonding member so as to cause part of the bonding member to disperse and deposit on the water-repellent layer to form a resin layer.

According to the present invention, a piezoelectric vibrator having improved frequency stability and a manufacturing method therefor can be provided.

DETAILED DESCRIPTION OF THE PREFERRED EMBODIMENTS

Figure 1:
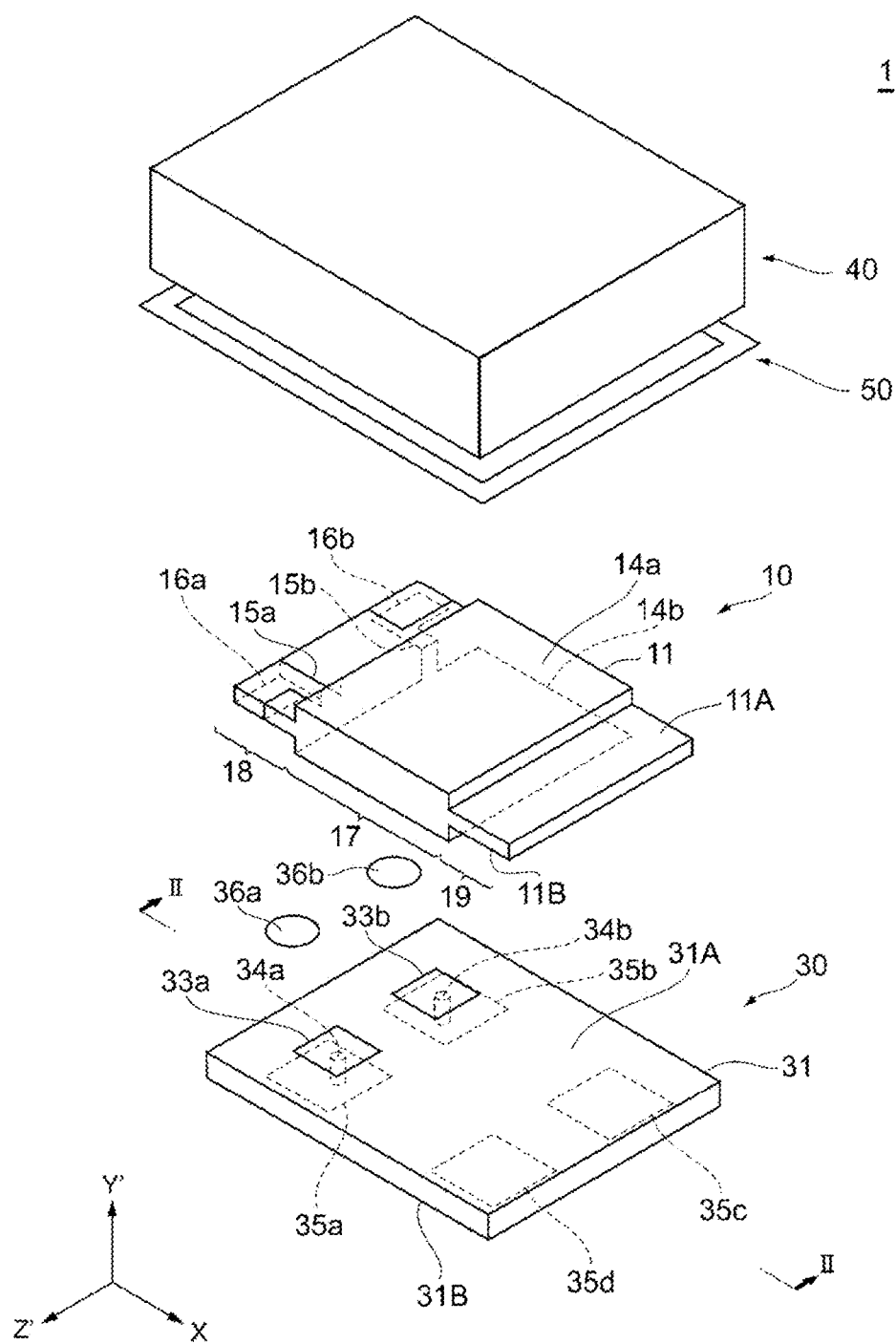
FIG. 1 is an exploded perspective view schematically illustrating the configuration of a crystal vibrator according to a First Embodiment.

Hereafter, embodiments of the present invention will be described while referring to the drawings. The drawings for each embodiment are representative, the dimensions and shapes of the individual parts are schematically illustrated, and the technical scope of the invention of the present application should not be interpreted as being limited to that of the embodiments.

First Embodiment

Figure 2:
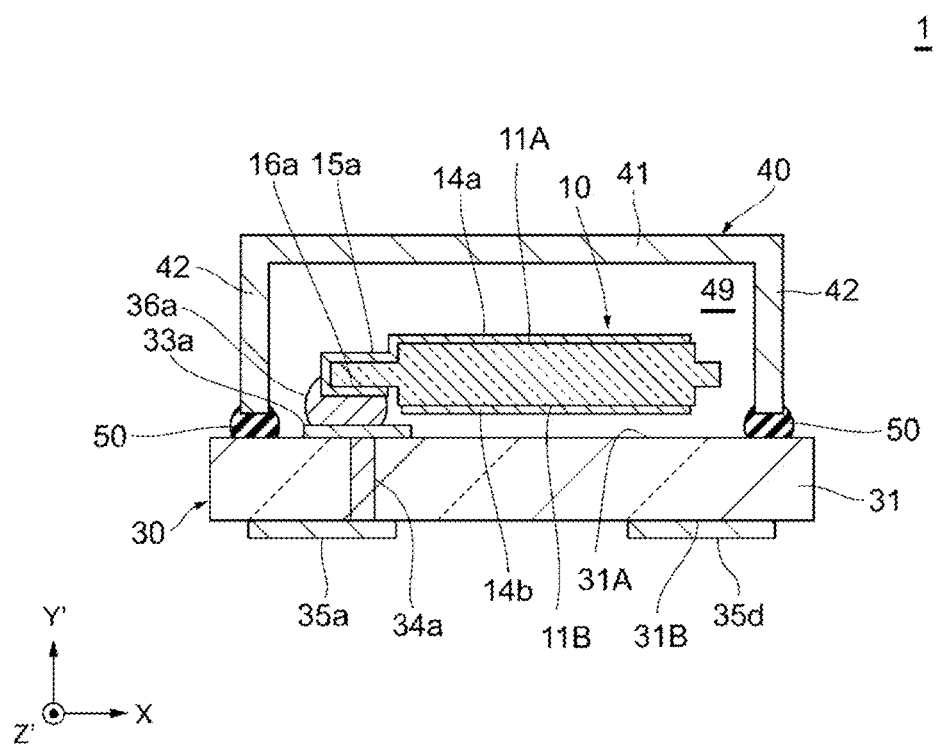
FIG. 2 is a sectional view schematically illustrating the configuration of the crystal vibrator according to the First Embodiment.

The configuration of a crystal vibrator 1 according to a First Embodiment of the present invention will be described while referring to FIGS. 1 and 2. FIG. 1 is an exploded perspective view schematically illustrating the configuration of the crystal vibrator according to the First Embodiment. FIG. 2 is a sectional view schematically illustrating the configuration of the crystal vibrator according to the First Embodiment.

For convenience, each drawing may be labeled with a Cartesian coordinate system consisting of an X axis, a Y' axis, and a Z' axis in order to help clarify the relationships between the individual drawings and to aid in understanding the positional relationships between the individual components. The X axis, the Y' axis, and the Z' axis correspond to one another in the individual drawings. The X axis, the Y' axis, and the Z' axis respectively correspond to the crystallographic axes of a crystal piece 11, which is described later. The X axis corresponds to an electrical axis (polarity axis), a Y axis corresponds to a mechanical axis, and a Z axis corresponds to an optical axis. The Y' axis and the Z' axis are axes obtained by respectively rotating the Y axis and the Z axis around the X axis in a direction from the Y axis towards the Z axis by 35 degrees 15 minutes±1 minute 30 seconds.

In the following description, a direction parallel to the X axis is referred to as an "X axis direction", a direction parallel to the Y' axis is referred to as a "Y' axis direction", and a direction parallel to the Z' axis is referred to as a "Z' axis direction". In addition, the directions of the tips of the arrows of the X axis, Y' axis, and Z' axis are referred to as "+(plus)" directions and the directions opposite to these directions are referred to as "− (minus)" directions. For convenience, the +Y' axis direction is described as being an upward direction and the −Y' axis direction is described as being a downward direction, but the vertical orientation of the crystal vibrator 1 is not restricted. For example, in the following description, a +Y' axis direction side and a −Y' axis direction side of a crystal vibration element 10 are respectively referred to as an upper surface 11A and a lower surface 11B, but the crystal piece 11 may be disposed so that the upper surface 11A is located vertically below the lower surface 11B.

The crystal vibrator 1 includes the crystal vibration element 10, a base member 30, a cover member 40, and a bonding member 50. The crystal vibration element 10 is provided between the base member 30 and the cover member 40. The base member 30, the cover member 40, and the bonding member 50 form a holder that is for accommodating the crystal vibration element 10. In the example illustrated in FIGS. 1 and 2, the base member 30 is shaped like a flat plate and the cover member 40 has a bottomed cavity, which is for accommodating the crystal vibration element 10, on the side thereof near the base member 30. The crystal vibration element 10 is mounted on the base member 30. The shapes of the base member 30 and the cover member 40 are not limited to the above-described shapes so long as at least the part of the crystal vibration element 10 that is to be excited is accommodated in the holder. In addition, the method of holding the crystal vibration element 10 is not limited to the above-described method. For example, the base member 30 may have a bottomed cavity for accommodating the crystal vibration element 10 on the side thereof near the cover member 40. In addition, the base member 30 and the cover member 40 may sandwich therebetween the periphery of the part of the crystal vibration element 10 that is to be excited.

First, the crystal vibration element 10 will be described.

The crystal vibration element 10 is an element in which a crystal is made to vibrate using the piezoelectric effect and that performs conversion between electrical energy and mechanical energy. The crystal vibration element 10 includes the flake-like crystal piece 11, a first excitation electrode 14a and a second excitation electrode 14b that form a pair of excitation electrodes, a first lead-out electrode 15a and a second lead-out electrode 15b that form a pair of lead-out electrodes, and a first connection electrode 16a and a second connection electrode 16b that form a pair of connection electrodes.

The crystal piece 11 has the upper surface 11A and the lower surface 11B, which face each other. The upper surface 11A is located on the opposite side from the side that faces the base member 30, i.e., on the side that faces a top surface part 41 of the cover member 40, which is described later. The lower surface 11B is located on the side that faces the base member 30.

The crystal piece 11 is, for example, an AT-cut crystal piece. The AT-cut crystal piece 11 is formed so that, in the Cartesian coordinate system consisting of the intersecting X axis, Y' axis, and Z' axis, a surface parallel to a plane defined by the X axis and the Z' axis (Hereafter, referred to as an "XZ' plane". Applies in a similar manner for planes defined by other axes) is a main surface and a direction parallel to the Y' axis is a thickness direction. For example, the AT-cut crystal piece 11 is formed by etching a crystal substrate (for example, a crystal wafer) obtained by cutting and grinding down a synthetic quartz crystal.

The crystal vibration element 10 employing the AT-cut crystal piece 11 has high frequency stability over a wide range of temperatures. In the AT-cut crystal vibration element 10, a thickness shear vibration mode is used as a main vibration. The angle of rotation of the Y' axis and the Z' axis in the AT-cut crystal piece 11 may be set so that the axes are tilted from 35 degrees 15 minutes to equal to or more than −5 degrees and equal to or less than 15 degrees. A cut other than an AT cut may be used for the cut angle of the crystal piece 11. For example, a BT cut, a GT cut, a SC cut, and so on may be used. Furthermore, the crystal vibration element may be a tuning-fork-type crystal vibration element employing a crystal piece having a cut angle called a Z-plate.

The AT-cut crystal piece 11 has a long side direction in which long sides thereof that are parallel to the X axis direction extend, a short side direction in which short sides thereof that are parallel to the Z' axis direction extend, and a thickness direction in which a thickness dimension thereof that is parallel to the Y' axis direction extends. The crystal piece 11 has a rectangular shape when the upper surface 11A is seen in a plan view, and the crystal piece 11 includes an excitation part 17 that is located in the center and contributes to excitation and peripheral parts 18 and 19 that are adjacent to the excitation part 17. The excitation part 17 and the peripheral parts 18 and 19 are each formed in a strip shape across the entire width of the crystal piece 11 along the Z' axis direction. The peripheral part 18 is located on the −X axis direction side of the excitation part 17 and the peripheral part 19 is located on the +X axis direction side of the excitation part 17.

Note that the planar shape of the crystal piece 11 when the upper surface 11A is seen in the plan view is not limited to a rectangular shape. The planar shape of the crystal piece 11 may instead be a polygonal shape, a circular shape, an elliptical shape, or a combination of these shapes. The planar shape of the crystal piece 11 may be a tuning fork shape. In other words, the crystal piece 11 may include a base part and vibration arm parts that extend in parallel from the base part. A slit may be formed in the crystal piece 11 with the aim of suppressing leakage of vibrations and propagation of stress. The shapes of the excitation part 17 and the peripheral parts 18 and 19 of the crystal piece 11 are also not limited to strip-like shapes that extend across the entire width. For example, the planar shape of the excitation part may be an island-like shape that is adjacent to a peripheral part in the Z' axis direction and the planar shape of the peripheral part may be formed in a frame-like shape that surrounds the excitation part.

The crystal piece 11 has a so-called mesa structure in which the thickness of the excitation part 17 is larger than the thickness of the peripheral parts 18 and 19. In the crystal piece 11 having a mesa structure, leakage of vibrations from the excitation part 17 can be suppressed. The crystal piece 11 has a double-sided mesa structure and the excitation part 17 protrudes beyond the peripheral parts 18 and 19 on both the upper surface 11A side and the lower surface 11B side. The boundary between the excitation part 17 and the peripheral part 18 and the boundary between the excitation part 17 and the peripheral part 19 have tapered shapes in which the thickness changes in a continuous manner, but may instead have stepped shapes in which the thickness changes in a non-continuous manner. The boundaries may have a convex shape in which the change in thickness varies in a continuous manner or may have a bevel shape in which the change in thickness varies in a non-continuous manner. The crystal piece 11 may have a one-sided mesa structure in which the excitation part 17 protrudes beyond the peripheral parts 18 and 19 on only the upper surface 11A side or the lower surface 11B side. In addition, the crystal piece 11 may have a so-called reverse mesa structure in which the thickness of the excitation part 17 is smaller than the thickness of the peripheral parts 18 and 19.

The first excitation electrode 14a and the second excitation electrode 14b are provided on the excitation part 17. The first excitation electrode 14a is provided on the upper surface 11A side of the crystal piece 11 and the second excitation electrode 14b is provided on the lower surface 11B side of the crystal piece 11. In other words, the first excitation electrode 14a is provided on the main surface of the crystal piece 11 that is located on the side near the cover member 40 and the second excitation electrode 14b is provided on the main surface of the crystal piece 11 that is located on the side near the base member 30. The first excitation electrode 14a and the second excitation electrode 14b face each other with the crystal piece 11 interposed therebetween. When the upper surface 11A of the crystal piece 11 is seen in the plan view, the first excitation electrode 14a and the second excitation electrode 14b have rectangular shapes and are disposed so as to substantially entirely overlap each other. The first excitation electrode 14a and the second excitation electrode 14b are formed in strip-like shapes across the entire width of the crystal piece 11 along the Z' axis direction. The first excitation electrode 14a and the second excitation electrode 14b forming a pair of electrodes correspond to individual electrodes that face each other with the crystal piece 11 interposed therebetween.

The planar shapes of the first excitation electrode 14a and the second excitation electrode 14b when the upper surface 11A of the crystal piece 11 is seen in the plan view are not limited to rectangular shapes. The planar shapes of the first excitation electrode 14a and the second excitation electrode 14b may instead be polygonal shapes, circular shapes, elliptical shapes, or a combination of these shapes.

The first lead-out electrode 15a and the second lead-out electrode 15b are provided on the peripheral part 18. The first lead-out electrode 15a is provided on the upper surface 11A side of the crystal piece 11 and the second lead-out electrode 15b is provided on the lower surface 11B side of the crystal piece 11. The first lead-out electrode 15a electrically connects the first excitation electrode 14a and the first connection electrode 16a to each other. The second lead-out electrode 15b electrically connects the second excitation electrode 14b and the second connection electrode 16b to each other. For example, as illustrated in FIG. 1, one end of the first lead-out electrode 15a is connected to the first excitation electrode 14a on the excitation part 17 and the other end of the first lead-out electrode 15a is connected to the first connection electrode 16a on the peripheral part 18. In addition, one end of the second lead-out electrode 15b is connected to the second excitation electrode 14b on the excitation part 17 and the other end of the second lead-out electrode 15b is connected to the second connection electrode 16b on the peripheral part 18. The first lead-out electrode 15a and the second lead-out electrode 15b are preferably separated from each other when the upper surface 11A of the crystal piece 11 is seen in the plan view in order to reduce stray capacitances. For example, the first lead-out electrode 15a is provided on the +Z' axis direction side when looking from the second lead-out electrode 15b.

The first connection electrode 16a and the second connection electrode 16b are electrodes for respectively connecting the first excitation electrode 14a and the second excitation electrode 14b to the base member 30, and are provided on the lower surface 11B side of the crystal piece 11 in the peripheral part 18. The first connection electrode 16a is provided at a corner formed between an edge of the crystal piece 11 on the −X axis direction side and an edge of the crystal piece 11 on the +Z' axis direction side and the second connection electrode 16b is provided at a corner formed between an edge of the crystal piece 11 on the −X axis direction side and an edge of the crystal piece 11 on the −Z' axis direction side.

Next, the base member 30 will be described.

The base member 30 holds the crystal vibrating element 10 in such a manner that the crystal vibration element 10 can be excited. The base member 30 includes a base 31 having an upper surface 31A and a lower surface 31B, which face each other. The upper surface 31A is located on the side near the crystal vibration element 10 and the cover member 40 and corresponds to a mounting surface on which the crystal vibration element 10 is mounted. The lower surface 31B corresponds to a mounting surface that will face a circuit board when the crystal vibrator 1 is mounted on an external circuit board, for example. The base 31 consists of a sintered material such as insulating ceramic (alumina). The base 31 is preferably formed of a heat-resistant material from the viewpoint of suppressing generation of thermal stress. From the viewpoint of suppressing stress acting on the crystal vibration element 10 due to thermal history, the base 31 may be formed of a material having a coefficient of thermal expansion close to that of the crystal piece 11 and, for example, may be formed of a crystal.

The base member 30 includes a first electrode pad 33a and a second electrode pad 33b, which form a pair of electrode pads. The first electrode pad 33a and the second electrode pad 33b are provided on the upper surface 31A of the base 31. The first electrode pad 33a and the second electrode pad 33b are terminals for electrically connecting the crystal vibration element 10 to the base member 30. From the viewpoint of suppressing degradation of reliability due to oxidation, the outermost surfaces of the first electrode pad 33a and the second electrode pad 33b desirably contain gold and more desirably are substantially composed of only gold. For example, the first electrode pad 33a and the second electrode pad 33b may each have a two-layer structure consisting of a base layer that improves adhesion with the base 31 and a surface layer that contains gold and suppresses oxidation.

The base member 30 includes a first outer electrode 35a, a second outer electrode 35b, a third outer electrode 35c, and a fourth outer electrode 35d. The first to fourth outer electrodes 35a to 35d are provided on the lower surface 31B of the base 31. The first outer electrode 35a and the second outer electrode 35b are terminals for electrically connecting an external substrate, which is not illustrated, and the crystal vibrator 1 to each other. The third outer electrode 35c and the fourth outer electrode 35d are dummy electrodes to or from which no electrical signals or the like are input or output, but the third outer electrode 35c and the fourth outer electrode 35d may instead be ground electrodes that ground the cover member 40 and thereby improve an electromagnetic shielding function of the cover member 20. Note that the third outer electrode 35c and the fourth outer electrode 35d may instead be omitted.

The first electrode pad 33a and the second electrode pad 33b are disposed in a line along the Z' axis direction on an end portion of the base member 30 that is on the −X axis direction side. The first outer electrode 35a and the second outer electrode 35b are disposed in a line along the Z' axis direction on an end portion of the base member 30 that is on the −X axis direction side. The third outer electrode 35c and the fourth outer electrode 35d are disposed in a line along the Z' axis direction on an end portion of the base member 30 that is on the +X axis direction side. The first electrode pad 33a is electrically connected to the first outer electrode 35a via a first through electrode 34a that penetrates through the base 31 in the Y' axis direction. The second electrode pad 33b is electrically connected to the second outer electrode 35b via a second through electrode 34b that penetrates through the base 31 in the Y' axis direction.

The first electrode pad 33a and the second electrode pad 33b may instead be respectively electrically connected to the first outer electrode 35a and the second outer electrode 35b via side surface electrodes provided on side surfaces of the base 31 connecting the upper surface 31A and the lower surface 31B to each other. The first to fourth outer electrodes 35a to 35d may instead be castellated electrodes that are provided in a recessed manner in the side surfaces of the base 31.

The base member 30 includes a first electrically conductive holding member 36a and a second electrically conductive holding member 36b, which form a pair of electrically conductive holding members. The first electrically conductive holding member 36a and the second electrically conductive holding member 36b are used to mount the crystal vibration element 10 on the base member 30 and electrically connect the crystal vibration element 10 and the base member 30 to each other. The first electrically conductive holding member 36a is bonded to the first electrode pad 33a and the first connection electrode 16a and electrically connects the first electrode pad 33a and the first connection electrode 16a to each other. The second electrically conductive holding member 36b is bonded to the second electrode pad 33b and the second connection electrode 16b and electrically connects the second electrode pad 33b and the second connection electrode 16b to each other. The first electrically conductive holding member 36a and the second electrically conductive holding member 36b hold the crystal vibration element 10 at a certain distance from the base member 30 so that the excitation part 17 can be excited.

The first electrically conductive holding member 36a and the second electrically conductive holding member 36b consist of a cured electrically conductive adhesive such as a thermosetting resin or a light-curable resin, and the main component of the first electrically conductive holding member 36a and the second electrically conductive holding member 36b is, for example, silicone resin. The first electrically conductive holding member 36a and the second electrically conductive holding member 36b contain electrically conductive particles and, for example, metal particles containing silver (Ag) are used as the electrically conductive particles. The first electrically conductive holding member 36a bonds the first electrode pad 33a and the first connection electrode 16a to each other and the second electrically conductive holding member 36b bonds the second electrode pad 33b and the second connection electrode 16b to each other.

The main component of the first electrically conductive holding member 36a and the second electrically conductive holding member 36b is not limited to silicone resin so long as the main component is a curable resin, and for example, the main component may be epoxy resin or acrylic resin. In addition, the way in which electrical conductivity is imparted to the first electrically conductive holding member 36a and the second electrically conductive holding member 36b is not limited to the use of silver particles, and electrically conductivity may alternatively be imparted by using other metals, electrically conductive ceramics, electrically conductive organic materials, and so on. The main component of the first electrically conductive holding member 36a and the second electrically conductive holding member 36b may be an electrically conductive polymer.

The resin composition of the first electrically conductive holding member 36a and the second electrically conductive holding member 36b may contain appropriately chosen additives. The additives may be, for example, adhesion-imparting agents, fillers, thickeners, sensitizers, anti-aging agents, defoamers, and so on for improving the workability and preservability of the electrically conductive adhesives. In addition, a filler may be added for the purpose of increasing the strength of the cured material or for helping to maintain the distance between the base member 30 and the crystal vibration element 10.

Next, the cover member 40 will be described.

The cover member 40 is bonded to the base member 30 and forms an internal space 49 in which the crystal vibration element 10 is accommodated between the cover member 40 and the base member 30. The material of the cover member 40 is not particularly limited, and for example, the cover member 40 may be formed of an electrically conductive material such as a metal. The cover member 40 is given an electromagnetic shielding function for reducing the entry and exit of electromagnetic waves into and out of the internal space 49 by forming the cover member 40 of an electrically conductive material.

The cover member 40 has a planar top surface part 41 and a side wall part 42 that is connected to the outer periphery of the top surface part 41 and extends in a direction that intersects the main surfaces of the top surface part 41. The planar shape of the top surface part 41 in the plan view in a direction perpendicular to the main surfaces thereof is, for example, a rectangular shape. The top surface part 41 faces the base member 30 with the crystal vibration element 10 interposed therebetween and the side wall part 42 surrounds the periphery of the crystal vibration element 10 in directions parallel to the XZ' plane. The leading end of the side wall part 42 extends in a frame-like shape at a position nearer to the base member 30 than the crystal vibration element 10 is.

The cover member 40 may be formed of a ceramic material, a semiconductor material, a resin material, or the like. In addition, the planar shape of the top surface part 41 may instead be a polygonal shape, a circular shape, an elliptical shape, or a combination of these shapes.

Next, the bonding member 50 will be described.

The bonding member 50 is provided along the entire outer peripheries of the base member 30 and the cover member 40 and has a rectangular frame-like shape. When the upper surface 31A of the base member 30 is seen in the plan view, the first electrode pad 33a and the second electrode pad 33b are disposed inside from the bonding member 50 and the bonding member 50 is provided so as to surround the crystal vibration element 10. The bonding member 50 bonds the leading end of the side wall part 42 of the cover member 40 and the upper surface 31A of the base 31 of the base member 30 to each other and seals the internal space 49. The bonding member 50 is composed of a resin material. The bonding member 50 desirably has a high gas barrier property, and more desirably has low moisture permeability. The bonding member 50 is, for example, a cured adhesive having epoxy resin as a main component. The resin-based adhesive forming the bonding member 50 may, for example, include a polyimide resin, a vinyl compound, an acrylic compound, a urethane compound, a silicone compound, and so on.

Note that the bonding member 50 is not limited to having a frame shape that is continuous along the peripheral direction and may instead be provided in a discontinuous manner along the peripheral direction. The bonding member 50 may be formed of a cured silicon-based adhesive containing water glass or the like, a cured calcium-based adhesive containing cement or the like, or a Au—Sn alloy based metallic solder. When the bonding member 50 is formed of metallic solder, a metallization layer may be provided on the base member 30 in order to improve the adhesion between the base member 30 and the bonding member 50. The bonding member 50 may include a cured resin-based adhesive and a coating that is has lower moisture permeability than the cured resin-based adhesive.

Figure 3:
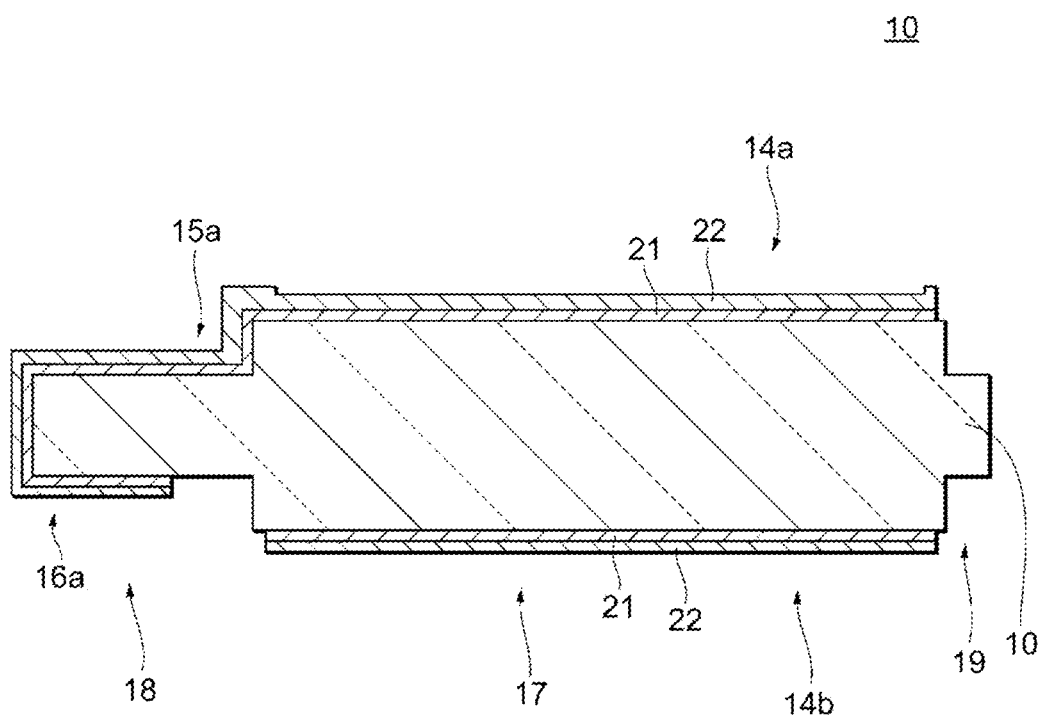
FIG. 3 is a sectional view schematically illustrating the configuration of the electrodes of a crystal vibration element.
Figure 4:
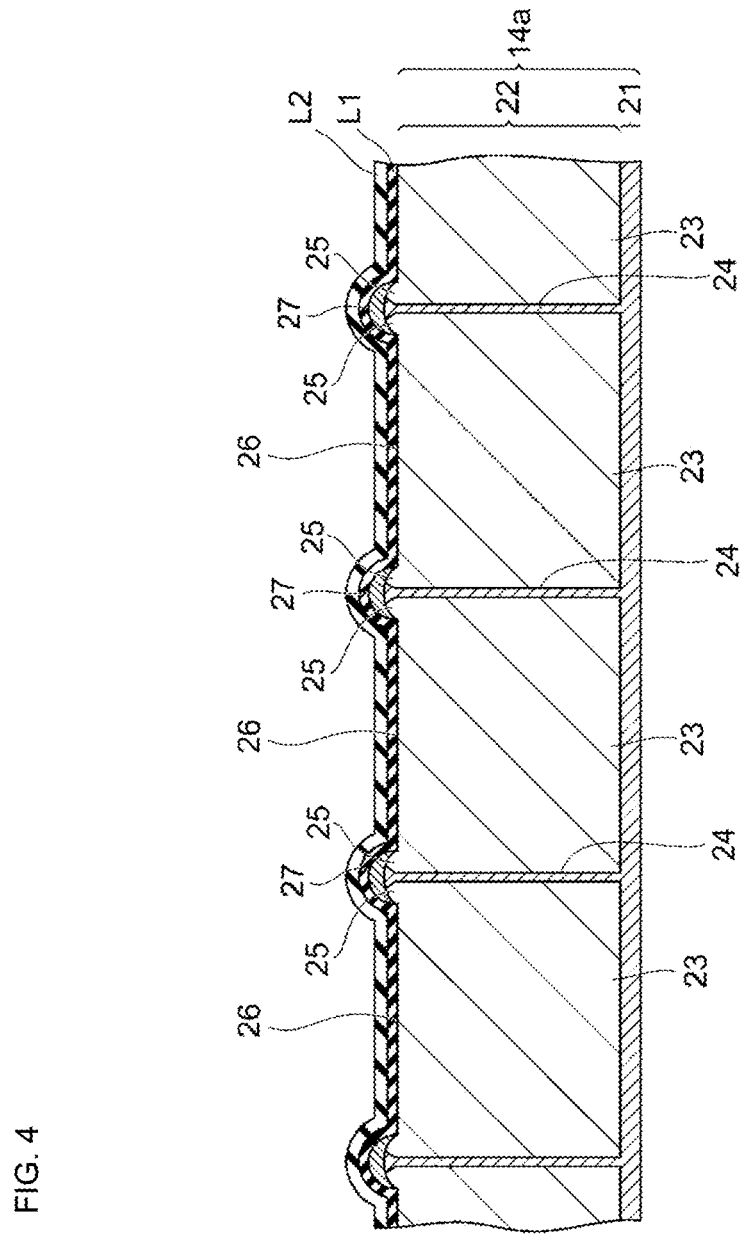
FIG. 4 is a sectional view schematically illustrating the configuration of a surface of a center part of a first excitation electrode.

Next, the configurations of the electrodes of the crystal vibration element 10 and the surfaces of the electrodes will be described in more detail while referring to FIGS. 3 and 4. FIG. 3 is a sectional view schematically illustrating the configuration of the electrodes of the crystal vibration element. FIG. 4 is a plan view schematically illustrating the configuration of the surface of a center part of the first excitation electrode.

The crystal vibration element 10 has a pair of electrodes. In the example illustrated in FIG. 3, one electrode, out of the pair of electrodes, includes the first excitation electrode 14a, the first lead-out electrode 15a, and the first connection electrode 16a and the other electrode, out of the pair of electrodes, includes the second excitation electrode 14b, the second lead-out electrode 15b, and the second connection electrode 16b. One group of electrodes consisting of the first excitation electrode 14a, the first lead-out electrode 15a, and the first connection electrode 16a is formed so that the electrodes are continuous with each other. In this case, this group of electrodes may be formed so that the electrodes are integrated with each other. The other electrode group consisting of the second excitation electrode 14b, the second lead-out electrode 15b, and the second connection electrode 16b may be formed so that the electrodes are continuous with each other and may be formed so that the electrodes are integrated with each other. In this embodiment, the pair of electrodes of the crystal vibration element 10 each include a base layer 21 and a surface layer 22.

The base layers 21 contact the crystal piece 11 and are provided between the crystal piece 11 and the surface layers 22. The base layers 21 are formed of a material having better adhesion to the crystal piece 11 than the material of the surface layers 22. In this embodiment, the base layers 21 contain chromium (Cr) as a main component. The base layers 21 are, for example, Cr films deposited on the surfaces of the crystal piece 11 using a sputtering method. The base layers 21 correspond to first layers of the first excitation electrode 14a and the second excitation electrode 14b. Note that the main component of the base layers 21 does not have to be Cr so long as the main component has high affinity to silicon oxide and may be nickel (Ni), for example.

The surface layers 22 are provided on the opposite sides of the base layers 21 from the crystal vibration element 10. For example, the thicknesses of the surface layers 22 may be larger than the thicknesses of the base layers 21. The surface layers 22 are formed using a material having higher chemical stability than the material forming the base layers 21. In this embodiment, the surface layers 22 contain gold (Au) as a main component. The surface layers 22 are, for example, Au films deposited on the surfaces of the base layers 21 using a sputtering method. In this embodiment, the thickness of the surface layer 22 of the first excitation electrode 14a is larger than the thickness of the surface layer 22 of the second excitation electrode 14b. In addition, when a portion of the surface layer 22 of the first excitation electrode 14a is removed by ion mining in order to carry out frequency adjustment as described later, the central portion in the XZ' plane may be cut away more deeply than the surrounding region. In other words, the center part of the surface of the first excitation electrode 14a in the XZ' plane may have a concave shape. The thickness of the surface layer 22 of the first excitation electrode 14a may instead be made substantially uniform by increasing the area subjected to ion milling.

Here, if a chromium oxide film is formed on the surface layer of the excitation electrode as described in Patent Document 1, the oxidation will not proceed any further, and therefore the frequency should not fluctuate. However, in reality, the frequency will fluctuate after a heating process that is performed later. Therefore, the inventors focused on the chromium compound present at the surface of the surface layer 22 of the first excitation electrode 14a. When image analysis was performed on the surface of the surface layer 22 using a field emission-scanning electron microscope (FE-SEM), as illustrated in FIG. 4, surface parts 26 of a plurality of crystal grains 23 composed of gold were exposed at the surface of the surface layer 22 and a chromium compound 27 surrounded the peripheries of these surface parts 26 in a web-like pattern.

In more detail, the surface layer 22 consists of a polycrystalline material in which the plurality of crystal grains 23 aggregate together. Grain boundaries 24 between the plurality of crystal grains 23 act as diffusion pathways for chromium that has diffused from the base layer 21. The plurality of crystal grains 23 include boundary parts 25 located near the grain boundaries 24 and the surface parts 26 surrounded by the boundary parts 25. The boundary parts 25 are raised above the surface parts 26 in the first excitation electrode 14a. In addition, the boundary parts 25 are covered by the chromium compound 27. Therefore, as illustrated in FIG. 4, the surface of the first excitation electrode 14a consists of the web-shaped chromium compound 27 and the surface parts 26 of the plurality of crystal grains 23 surrounded by the chromium compound 27. The chromium compound 27 is chromium oxide or chromium oxide hydrate, resulting from chromium in the base layer 21 diffusing along the grain boundaries of the surface layer 22 and becoming oxidized at the surface of the surface layer 22.

The inventors hypothesized that frequency fluctuations in the subsequent heating process were caused by newly diffused chromium from the grain boundaries 24 lifting up the chromium compound 27 and the chromium exposed near the boundary parts 25 becoming oxidized. It is desirable to inhibit contact between chromium and moisture in order to suppress the formation of the chromium compound 27.

As illustrated in FIG. 4, a water-repellent layer L1 and a resin layer L2 are provided on the surface of the first excitation electrode 14a. The resin layer L2 traps moisture in the atmosphere of the crystal vibration element 10 and impedes the moisture from reaching the first excitation electrode 14a. The water-repellent layer L1 impedes moisture from penetrating from the resin layer L2 to the first excitation electrode 14a. Although not illustrated, the water-repellent layer L1 and the resin layer L2 are also provided on the surface of the second excitation electrode 14b. It is sufficient that the water-repellent layer L1 and the resin layer L2 be provided on at least one surface out of the surface of the first excitation electrode 14a and the surface of the second excitation electrode 14b, but are preferably provided on both surfaces.

The water-repellent layer L1 is provided between the surface layer 22 and the resin layer L2 and contacts the surface of the first excitation electrode 14a. The water-repellent layer L1 has lower moisture permeability than the resin layer L2. The water-repellent layer L1 is formed of a hydrophobic resin material, for example. The material forming the water-repellent layer L1 contains silicone resin, for example. The water-repellent layer L1 is provided in regions containing the grain boundaries 24. In other words, the water-repellent layer L1 is at least provided above the boundary parts 25 so as to cover the chromium compound 27. The water-repellent layer L1 desirably covers the surface of the first excitation electrode 14a. In other words, the water-repellent layer L1 desirably covers in a continuous manner the surface parts 26 and the chromium compound 27 constituting the surface of the first excitation electrode 14a. For example, the thickness of the parts of the water-repellent layer L1 on the surface parts 26 is larger than the thickness of the parts of the water-repellent layer L1 on the chromium compound 27.

The resin layer L2 is provided above the surface layer 22 and contacts the surface of the water-repellent layer L1. The resin layer L2 is formed of a resin material having high heat resistance, for example. The material constituting the resin layer L2 contains an epoxy resin or polyimide resin, for example. The thickness of the resin layer L2 is larger than the thickness of the water-repellent layer L1.

Figure 5:
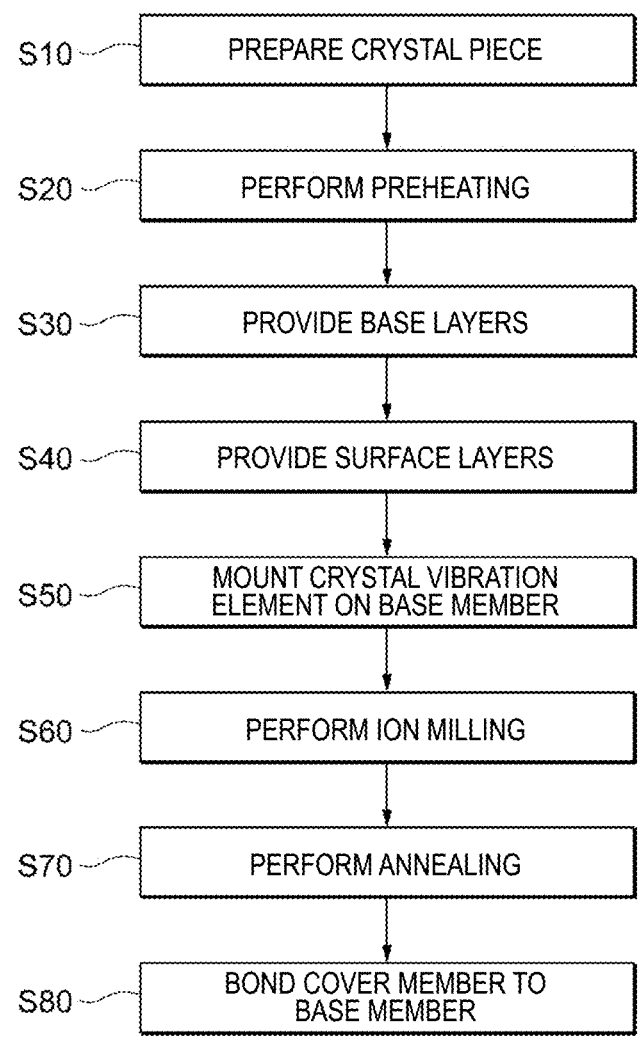
FIG. 5 is a flowchart schematically illustrating a method of manufacturing the crystal vibrator according to the First Embodiment.
Figure 6:
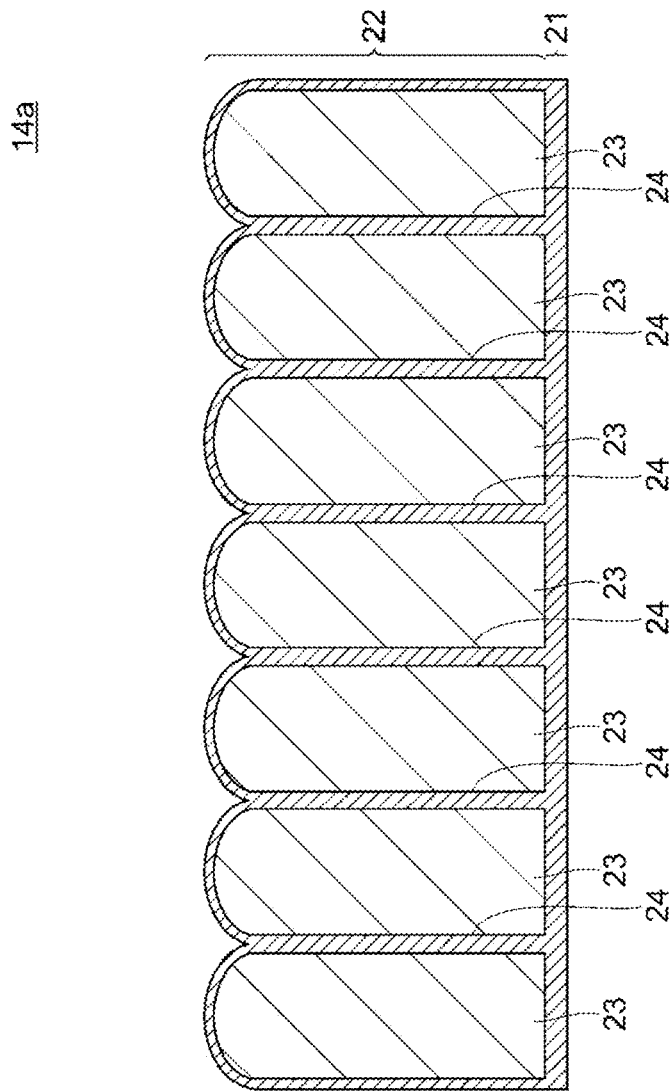
FIG. 6 is a sectional view schematically illustrating the first excitation electrode prior to performance of ion milling.
Figure 7:
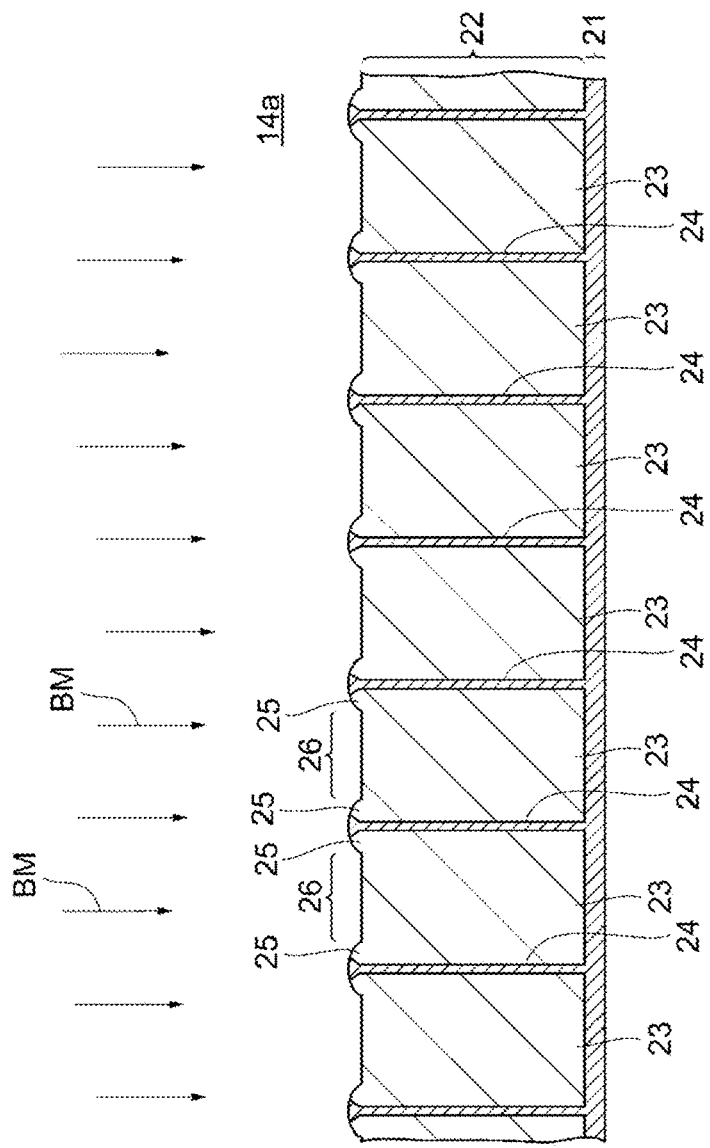
FIG. 7 is a sectional view schematically illustrating changes in the first excitation electrode caused by ion milling.
Figure 8:
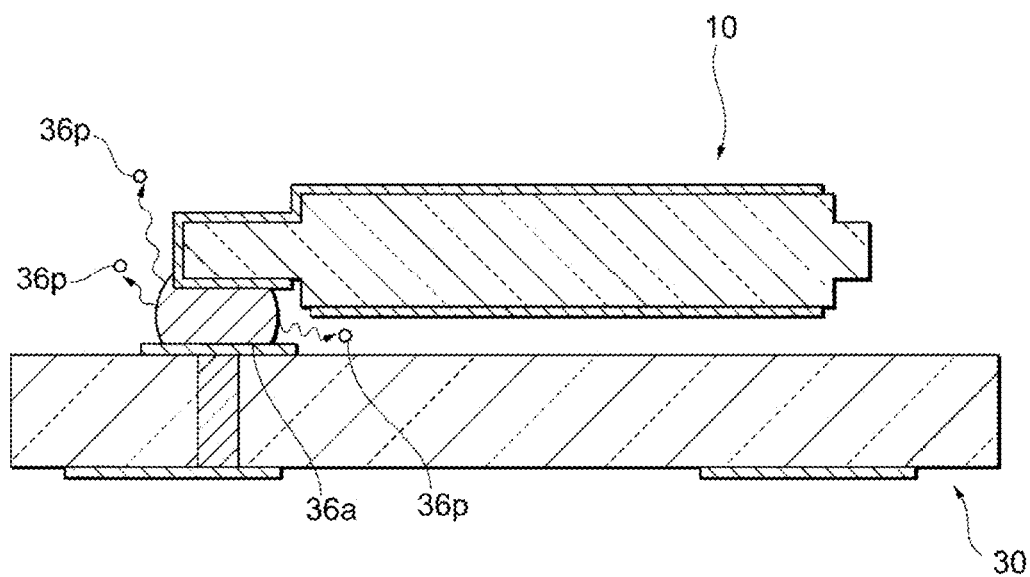
FIG. 8 is a sectional view schematically illustrating changes in an electrically conductive holding member caused by annealing.
Figure 9:
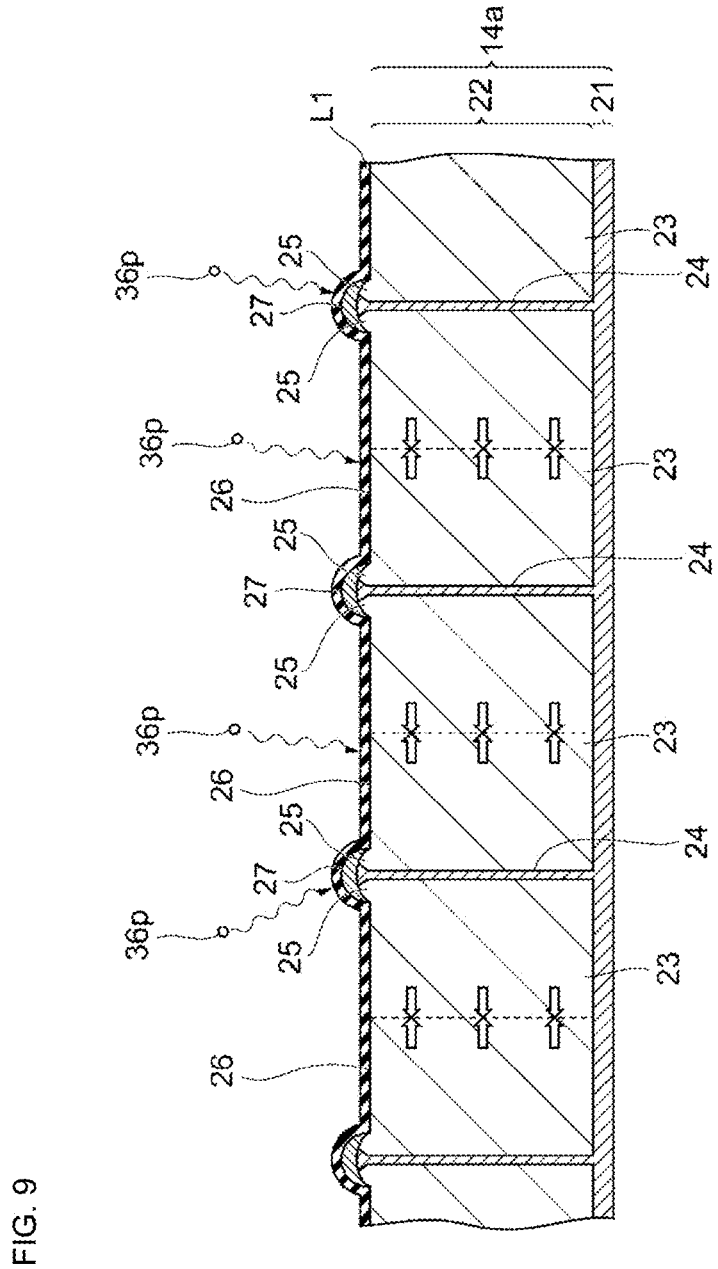
FIG. 9 is a sectional view schematically illustrating changes in the first excitation electrode caused by annealing.
Figure 10:
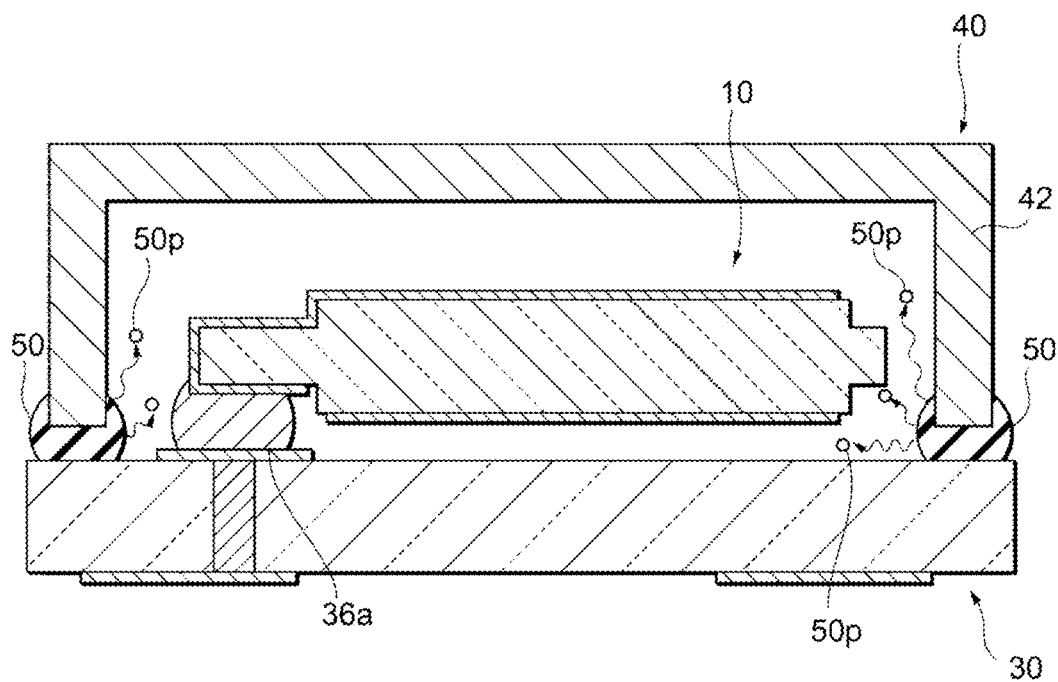
FIG. 10 is a sectional view schematically illustrating changes in a bonding member in a bonding step.
Figure 11:
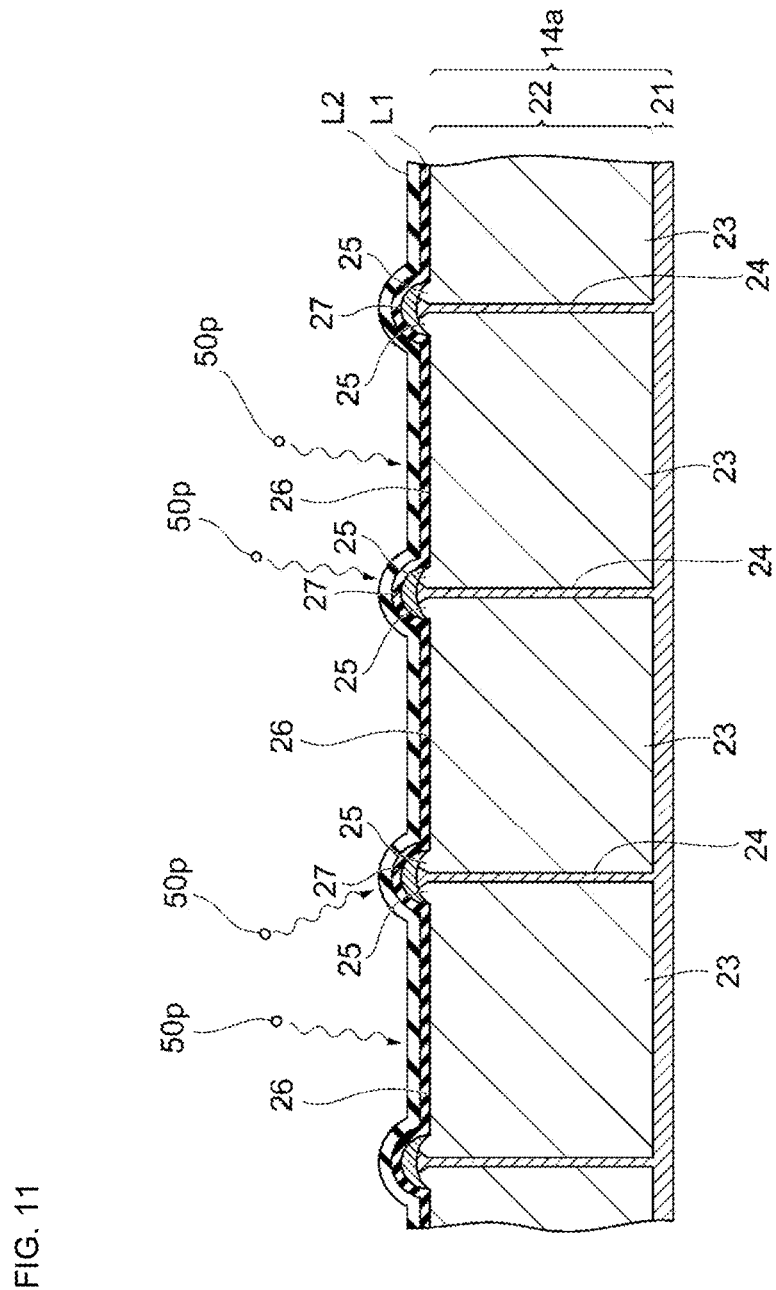
FIG. 11 is a sectional view schematically illustrating changes in the first excitation electrode in the bonding step.

Next, a method of manufacturing the crystal vibrator 1 will be described while referring to FIGS. 5 to 11. FIG. 5 is a flowchart schematically illustrating a method of manufacturing the crystal vibrator according to the First Embodiment. FIG. 6 is a sectional view schematically illustrating the first excitation electrode prior to performance of ion milling. FIG. 7 is a sectional view schematically illustrating changes in the first excitation electrode caused by ion milling. FIG. 8 is a sectional view schematically illustrating changes in an electrically conductive holding member caused by annealing. FIG. 9 is a sectional view schematically illustrating changes in the first excitation electrode caused by annealing. FIG. 10 is a sectional view schematically illustrating changes in a bonding member in a bonding step. FIG. 11 is a sectional view schematically illustrating changes in the first excitation electrode in the bonding step.

First, a crystal piece is prepared (S10).

In this Step S10, first, a crystal substrate is cut from a synthetic crystal so that the main surfaces of the crystal substrate extend along the XZ' plane. Next, parts of the crystal substrate are removed by performing wet etching using a photolithography method in order to form the outline of the crystal piece 11 when the XZ' plane is seen in the plan view. Next, the crystal piece 11 is shaped into a double-sided mesa structure by partially removing the parts of the crystal piece 11 that correspond to the peripheral parts 18 and 19 by performing wet etching. The method used to form and shape the crystal piece 11 is not limited to wet etching and dry etching may instead be used, for example. The crystal piece 11 may be formed by cutting the crystal substrate into individual crystal pieces 11 by using a dicing machine and a beveling process may be performed on the resulting individual crystal pieces 11.

Next, the pair of electrodes, which includes individual electrodes that face each other, are provided so that the crystal piece 11 is interposed therebetween using a sputtering method such as a magnetron sputtering method.

This step includes Step S20 of performing preheating, Step S30 of providing the base layers 21, and Step S40 of providing the surface layers 22.

In Step S20 of performing the preheating, the crystal piece 11 is heated to equal to or higher than 150° C. and equal to or lower than 300° C. If the temperature of the crystal piece 11 is lower than 150° C., the average grain size of the crystal grains 23 of the surface layers 22 becomes smaller and diffusion of chromium progresses more readily. The crystal grains cannot be sufficiently grown even in grain growth by annealing, which will be described later. If the temperature of the crystal piece 11 is higher than 300° C., chromium diffusion overcomes the suppression of chromium diffusion by grain growth, and the amount of chromium that rises from the surface of the excitation electrode increases.

Step S20 of performing preheating may be omitted. In this embodiment, the water-repellent layer L1 and the resin layer L2 inhibit the bonding of moisture to the chromium that rises from the electrode surface. Therefore, changes that occur over time in the mass of the excitation part 17 of the crystal vibration element 10 can be sufficiently suppressed even when the base layers 21 and surface layers 22 are provided without performing preheating.

Step S30 of providing the base layers 21 and Step S40 of providing the surface layers 22 are carried out by performing pattern deposition using a metal mask with a sputtering method. In Step S30, using chromium as a sputtering target, chromium is deposited on the surfaces of the preheated crystal piece 11 to form the base layers 21 of the electrode patterns. The thickness of the base layers 21 is, for example, 5 nm. In Step S40, the surface layers 22 of the electrode patterns are formed by depositing gold on the surfaces of the base layers 21 using gold as a sputtering target. As illustrated in FIG. 6, the plurality of crystal grains 23 grow in columnar shapes from the base layers 21. Chromium diffuses along the grain boundaries 24 and the surfaces of the crystal grains 23. At this time, the thickness of the surface layer 22 on the upper surface 11A side of the crystal piece 11 is, for example, 140 nm. In order to increase the margin by which the frequency may be adjusted using ion milling, which will be described later, the surface layers 22 are provided so that the thickness of the surface layer 22 on the upper surface 11A side of the crystal piece 11 is larger than the thickness of the surface layer 22 on the lower surface 11B side of the crystal piece 11.

If Step S30 of providing the base layers 21 and Step S40 of providing the surface layers 22 are carried out using pattern deposition using a metal mask, it is difficult to raise the temperature of the crystal piece 11 in the deposition chamber in which Step S30 or Step S40 is performed due to the large heat capacity of the metal mask. Therefore, Step S20 of performing preheating is performed in a chamber prior to the deposition chamber.

The preheating may be performed in the deposition chamber, and may be performed during the deposition of at least one out of the base layers 21 and the surface layers 22 or between the deposition of the base layers 21 and the deposition of the surface layers 22. The step of providing the electrodes on the surfaces of the crystal piece 11 is not limited to pattern deposition. After depositing the base layers 21 and the surface layers 22 over the entire surfaces of the crystal piece 11, parts of the base layers 21 and the surface layers 22 may be removed by etching in order to form the electrode patterns. The method of depositing the base layers 21 and the surface layers 22 is not limited to a sputtering method and the method may be appropriately selected from among various vapor deposition methods such as physical vapor deposition (PVD) and chemical vapor deposition (CVD). Furthermore, the base layers 21 and the surface layers 22 may be deposited using a deposition method other than a vapor phase growth method such as a printing method or a plating method.

Next, the crystal vibration element is mounted on the base member (S50).

First, a paste-like resin composition, which is the material for forming the first electrically conductive holding member 36a and the second electrically conductive holding member 36b, is applied onto the first electrode pad 33a and second electrode pad 33b of the base member 30. Next, the crystal vibration element 10 is placed on the resin composition and the first electrically conductive holding member 36a and the second electrically conductive holding member 36b are formed by curing the resin composition. The resin composition of the first electrically conductive holding member 36a and the second electrically conductive holding member 36b may be applied to the crystal vibration element 10 in advance.

Next, ion milling is performed (S60).

As illustrated in FIG. 7, at least part of the surface of the first excitation electrode 14a is irradiated with an ion beam BM in order to remove part of the surface layer 22. In this way, the frequency of the crystal vibration element 10 is adjusted by changing the mass of the excitation part 17 of the crystal vibration element 10. In other words, Step S60 corresponds to a frequency adjustment step. Specifically, part of the first excitation electrode 14a is removed while monitoring the frequency by applying a voltage to the first excitation electrode 14a and the second excitation electrode 14b in order to gradually increase the frequency to the target frequency.

The speed at which gold is removed by the ion beam BM is higher than the speed at which chromium is removed. Therefore, at the end of Step S60, the boundary parts 25 are raised up from the surface parts 26 due to the effect of the chromium having diffused along the grain boundaries 24.

Next, annealing is performed (S70).

Lattice defects created in the plurality of crystal grains 23 by the ion milling are reduced by performing annealing and the plurality of crystal grains 23 are recrystallized. In addition, adjacent crystal grains 23 fuse together as a result of the recrystallized plurality of crystal grains 23 undergoing grain growth or as illustrated in FIG. 9. As a result, the grain size of each of the plurality of crystal grains 23 is increased and the grain boundaries, which are diffusion pathways for chromium, are reduced.

In this Step S70, in addition to annealing the individual electrodes, portions of the electrically conductive holding members are dispersed and deposited on the surfaces of the individual electrodes. As illustrated in FIGS. 8 and 9, resin particles 36p dispersed from the first electrically conductive holding member 36a are deposited on the surface of the first excitation electrode 14a and form the water-repellent layer L1. The resin particles 36p are also dispersed from the second electrically conductive holding member 36b and are deposited on the surface of the second excitation electrode 14b. Since the water-repellent layer L1 is formed of the resin particles 36p originating from the pair of electrically conductive holding members 36a and 36b, the pair of electrically conductive holding members 36a and 36b contain the same material as that forming the water-repellent layer L1. The thickness of the water-repellent layer L1 is on the order of several nm to 10 nm, for example. In order to obtain a water-repellent layer L1 that has good film quality and is of sufficient thickness, it is desirable to perform the heat treatment in an inert gas rather than in a vacuum, and it is desirable to perform the heat treatment at a higher temperature and for a longer time than in the case of simple annealing. In this Step S70, for example, a heat treatment is performed in a nitrogen atmosphere at 240° C. for 6 hours.

Next, the cover member is bonded to the base member (S80).

First, a paste-like resin composition, which is the material for the bonding member 50, is applied to the leading end of the side wall part 42 of the cover member 40. Next, the bonding member 50 is formed by sandwiching the resin composition between the base member 30 and the cover member 40 and curing the resin composition.

In this Step S80, in addition to the cover member 40 being bonded to the base member 30, part of the bonding member 50 is made to disperse and deposit on the water-repellent layer L1. As illustrated in FIGS. 10 and 11, resin particles 50p dispersed from the bonding member 50 deposit on the surface of the water-repellent layer L1 formed on the surface of the first excitation electrode 14a and form the resin layer L2. The resin particles 50p also deposit onto the surface of the water-repellent layer L1 formed on the surface of the second excitation electrode 14b. Since the resin layer L2 is formed of the resin particles 50p originating from the bonding member 50, the bonding member 50 contains the same material as that forming the resin layer L2. The thickness of the resin layer L2 is on the order of several nm to 50 nm, for example.

The step of forming the water-repellent layer L1 may be performed separately from the step of performing annealing. In addition, the step of forming the resin layer L2 may be performed separately from the step of bonding the cover member 40 to the base member 30. For example, the step of forming the resin layer L2 may be performed prior to Step S50 of mounting the crystal vibration element 10 on the base member 30 or between Step S50 and Step S70 of performing annealing. The method of forming the water-repellent layer L1 and the resin layer L2 is not limited to a so-called dry process in which resin particles are deposited. The water-repellent layer L1 and the resin layer L2 may be formed using a wet process such as printing.

Hereafter, some or all of the embodiments of the present invention are listed and their effects are described. However, the present invention is not limited to the following embodiments.

According to an aspect of the present invention, a crystal vibrator includes: a crystal vibration element including a crystal piece and a pair of electrodes that face each other; and a holder that accommodates the crystal vibration element. A resin layer covers at least one electrode of the pair of electrodes. A water-repellent layer that has lower moisture permeability than the resin layer is between the electrode and the resin layer.

With this configuration, the resin layer traps moisture in the atmosphere of the crystal vibration element and impedes the moisture from reaching the electrode, and the water-repellent layer inhibits penetration of moisture from the resin layer to the electrode. Therefore, changes in the mass of the excitation part of the crystal vibration element are caused by the reversible moisture absorption and drying of the resin layer, and irreversible changes in the mass of the excitation part caused by oxidation and hydroxylation of the electrode can be inhibited. Therefore, variations in frequency that occur over time can be suppressed.

As an aspect, the crystal vibrator further includes a pair of electrically conductive holding members that hold the crystal vibration element in the holder. The pair of electrically conductive holding members contain a material the same as a material of the water-repellent layer.

With this configuration, formation of the electrically conductive holding members and formation of the water-repellent layer can be performed simultaneously by forming the water-repellent layer using a material originating from the electrically conductive holding members and the manufacturing process can be simplified.

As an aspect of this embodiment, the material forming the water-repellent layer contains silicone resin.

Thus, even if the electrode surface is deformed, for example, due to protrusions caused by diffusion from the base layer, the water-repellent layer is unlikely to be damaged and the moisture permeability is unlikely to be degraded.

As an aspect, the holder includes a base member, a cover member that forms an internal space in which the crystal vibration element is accommodated between the cover member and the base member, and a bonding member that bonds the base member and the cover member to each other.

In addition, the bonding member is composed of a resin material.

Although the manufacturing cost can be reduced when the holder is encapsulated with a resin material compared to when the holder is encapsulated with a metal material, airtightness is reduced. Therefore, chromium exposed at the electrode surface is oxidized and forms hydrates due to the entry of water vapor, and frequency fluctuations due to changes in the mass of the electrode are likely to occur. However, according to this embodiment, changes in the mass of the electrode can be suppressed and frequency fluctuations can be suppressed even though encapsulation is carried out using a resin material.

As an aspect, the bonding member contains a material the same as a material of the resin layer.

With this configuration, the bonding member and the water-repellent layer can be formed at the same time by forming the resin layer using material originating from the bonding member and the manufacturing process can be simplified.

As an aspect, a material forming the resin layer contains epoxy resin or polyimide resin.

With this configuration, the resin layer is formed of a heat-resistant resin material and therefore the deposition speed of the dry process is slowed down and the resin layer can be made thinner. Thus, changes in the mass of the excitation part caused by moisture absorption and drying of the resin layer can be suppressed. Furthermore, damage to the resin layer during a heat treatment taking place after formation of the resin layer such as a reflow process when mounting the crystal vibrator can be suppressed, and therefore damage to the water-repellent layer during the heat treatment can be suppressed and degradation of the moisture resistance can be suppressed.

As an aspect, at least one electrode out of the pair of electrodes includes a first layer containing gold and a second layer containing chromium provided between the crystal piece and the first layer. The water-repellent layer is provided in a region containing a grain boundary of gold in the first layer.

With this configuration, the water-repellent layer covers a grain boundary of gold that acts as a diffusion pathway of chromium and therefore oxidation and hydroxylation of chromium can be efficiently inhibited.

As an aspect, at least one electrode out of the pair of electrodes includes an excitation electrode and the water-repellent layer covers a surface of the excitation electrode.

With this configuration, the water-repellent layer covers the entire surface of the excitation electrode and therefore penetration of moisture along a boundary between the excitation electrode and the water-repellent layer can be inhibited. In particular, when the surface of the excitation electrode is composed of surface parts of gold crystal grains and exposed chromium, moisture adhering to the surface parts can be inhibited from penetrating along boundaries between the surface parts and the water-repellent layer and contacting the chromium due to the water-repellent layer covering the surface parts.

As another aspect of the present invention, a crystal vibrator manufacturing method includes: preparing a crystal piece; providing a pair of electrodes that face each other with the crystal piece interposed therebetween to form a crystal vibration element; mounting the crystal vibration element on a base member using an electrically conductive holding member; adjusting a frequency of the crystal vibration element by removing part of a first electrode of the pair of electrodes on a side of the crystal vibration element opposite to a side facing the base member; annealing the pair of electrodes so as to cause part of the electrically conductive holding member to disperse and deposit on surfaces of the pair of electrodes to form a water-repellant layer; and bonding a cover member to the base member using a bonding member so as to cause part of the bonding member to disperse and deposit on the water-repellent layer to form a resin layer.

Embodiments of the present invention are not limited to crystal vibrators and may also be applied to piezoelectric vibrators. An example of a piezoelectric vibrator (piezoelectric resonator unit) is a crystal vibrator (quartz crystal resonator unit) including a crystal vibration element (quartz crystal resonator). The crystal vibration element employs a crystal piece (quartz crystal element) as a piezoelectric piece that is excited using the piezoelectric effect, but the piezoelectric piece may instead be formed of an appropriately chosen piezoelectric material such as a piezoelectric single crystal, a piezoelectric ceramic, a piezoelectric thin film, or a piezoelectric polymer film. For example, lithium niobate (LiNbO$_3$) can be given as an example of a piezoelectric single crystal. Similarly, examples of a piezoelectric ceramic include barium titanate (BaTiO$_3$), lead titanate (PbTiO$_3$), lead zirconate titanate (Pb(Zr$_x$Ti$_{1-x}$)O$_3$; PZT), aluminum nitride (AlN), lithium niobate (LiNbO$_3$), lithium meta-niobate (LiNb$_2$O$_6$), bismuth titanate (Bi$_4$Ti$_3$O$_{12}$), lithium tantalate (LiTaO$_3$), lithium tetraborate (Li$_2$B$_4$O$_7$), langasite (La$_3$Ga$_5$SiO$_{14}$), and tantalum pentoxide (Ta$_2$O$_7$). The piezoelectric thin film may be formed by depositing the piezoelectric ceramic on a substrate composed of quartz, sapphire, or the like using a sputtering method, for example. Examples of the piezoelectric polymer film include polylactic acid (PLA), polyvinylidene fluoride (PVDF), and a vinylidene fluoride/trifluoroethylene (VDF/TrFE) copolymer. The various piezoelectric materials given above may be used by being stacked in layers or may be stacked on another member.

Embodiments of the present invention are not particularly limited and can be appropriately applied to any device that performs electromechanical energy conversion using the piezoelectric effect such as timing devices, sound generators, oscillators, and load sensors.

As described above, according to an aspect of the present invention, a piezoelectric vibrator having improved frequency stability and a manufacturing method therefor can be provided.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. For example, a vibration element and a vibrator of the present invention can be used in timing devices or load sensors. In addition, the elements included in the embodiments can be combined as much as technically possible and such combined elements are also included in the scope of the present invention so long as the combined elements have the characteristics of the present invention.

REFERENCE SIGNS LIST

1 . . . crystal vibrator
10 . . . crystal vibration element
11 . . . crystal piece
14a, 14b . . . excitation electrode
15a, 15b . . . lead-out electrode
16a, 16b . . . connection electrode
L1 . . . water-repellent layer
L2 . . . resin layer
21 . . . base layer
22 . . . surface layer
23 . . . crystal grain
24 . . . grain boundary
25 . . . boundary part
26 . . . surface part
27 . . . chromium compound
30 . . . base member
40 . . . cover member
50 . . . bonding member

The invention claimed is:

1. A piezoelectric vibrator comprising:
a piezoelectric vibration element that includes a piezoelectric piece and a pair of electrodes that face each other with the piezoelectric piece interposed therebetween;
a holder that accommodates the piezoelectric vibration element;
a resin layer covering at least one electrode of the pair of electrodes; and
a water-repellent layer, which has a lower moisture permeability than the resin layer, between the electrode and the resin layer.

2. The piezoelectric vibrator according to claim 1, further comprising:
a pair of electrically conductive holding members that hold the piezoelectric vibration element in the holder,
wherein the pair of electrically conductive holding members contain a material the same as a material of the water-repellent layer.

3. The piezoelectric vibrator according to claim 1, wherein the water-repellent layer contains a silicone resin.

4. The piezoelectric vibrator according to claim 1, wherein the holder includes a base member, a cover member that forms an internal space for accommodating the piezoelectric vibration element between the cover member and the base member, and a bonding member that bonds the base member and the cover member to each other.

5. The piezoelectric vibrator according to claim 4, wherein the bonding member contains a resin material.

6. The piezoelectric vibrator according to claim 4, wherein the bonding member contains a material the same as a material of the resin layer.

7. The piezoelectric vibrator according to claim 6, wherein the resin layer contains epoxy resin or polyimide resin.

8. The piezoelectric vibrator according to claim 1,
wherein the at least one electrode of the pair of electrodes includes a first layer containing gold and a second layer containing chromium between the piezoelectric piece and the first layer, and
the water-repellent layer is in a region containing a grain boundary of gold in the first layer.

9. The piezoelectric vibrator according to claim 8, wherein the grain boundary is covered with a chromium compound.

10. The piezoelectric vibrator according to claim 9, wherein a thickness of the water-repellent layer not covering the region containing the grain boundary of gold is larger than a thickness of the water-repellent layer on the chromium compound.

11. The piezoelectric vibrator according to claim 1, wherein the at least one electrode of the pair of electrodes includes an excitation electrode, and the water-repellent layer covers a surface of the excitation electrode.

12. The piezoelectric vibrator according to claim 1, wherein the piezoelectric vibration element is a crystal vibration element.

* * * * *